US012724062B2

(12) United States Patent
Krishnan et al.

(10) Patent No.: US 12,724,062 B2
(45) Date of Patent: Sep. 1, 2026

(54) LASER PERTURBATION PROBING

(71) Applicant: Advanced Micro Devices, Inc., Santa Clara, CA (US)

(72) Inventors: Ravikumar Venkat Krishnan, Singapore (SG); Gopinath Ranganathan, Singapore (SG); Jiann Min Chin, Singapore (SG)

(73) Assignee: Advanced Micro Devices, Inc., Santa Clara, CA (US)

( * ) Notice: Subject to any disclaimer, the term of this patent is extended or adjusted under 35 U.S.C. 154(b) by 502 days.

(21) Appl. No.: 18/314,079

(22) Filed: May 8, 2023

(65) Prior Publication Data

US 2025/0347731 A1 Nov. 13, 2025

(51) Int. Cl.

| | |
|---|---|
| ***G01R 31/265*** | (2006.01) |
| ***G01N 21/63*** | (2006.01) |
| ***G01N 21/65*** | (2006.01) |
| ***G01N 21/95*** | (2006.01) |
| ***G01R 31/27*** | (2006.01) |
| ***G01R 31/28*** | (2006.01) |
| ***G01R 31/311*** | (2006.01) |

(52) U.S. Cl.
CPC ..... *G01R 31/2656* (2013.01); *G01N 21/9501* (2013.01); *G01R 31/311* (2013.01)

(58) Field of Classification Search
CPC ...... G01R 31/26; G01R 31/265; G01R 31/27; G01R 31/28; G01R 31/31; G01R 31/2656; G01R 31/311; G01N 21/63; G01N 21/65; G01N 21/9501
See application file for complete search history.

(56) References Cited

U.S. PATENT DOCUMENTS

| | | | | |
|---|---|---|---|---|
| 10,012,692 | B2 * | 7/2018 | Ross .................. | G01R 31/3177 |
| 10,768,225 | B1 | 9/2020 | Ravikumar et al. | |
| 11,125,815 | B2 | 9/2021 | Ravikumar et al. | |
| 11,143,700 | B2 * | 10/2021 | Ravikumar .......... | G01R 31/311 |
| 2006/0066848 | A1 * | 3/2006 | Frankel ..................... | G01J 3/44 356/301 |
| 2015/0002182 | A1 * | 1/2015 | Eiles .................... | G01R 31/311 324/762.01 |

* cited by examiner

*Primary Examiner* — Neel D Shah
(74) *Attorney, Agent, or Firm* — Greenberg Traurig, LLP

(57) ABSTRACT

The disclosed method includes waveform extractions from a cross-talking environment by measuring a signal from a target circuit/transistor while deterministically stimulating a second circuit using a second laser and post-processing. The method includes analyzing the measured signal detecting a fault or an error in one of the circuits based on the analysis. Various other methods, systems, and computer-readable media are also disclosed.

15 Claims, 9 Drawing Sheets

LASER PERTURBATION PROBING

BACKGROUND

Laser or electro-optic probing can test transistors and other components of a chip by focusing a laser into a component through a silicon substrate of the chip and detect whether the component is toggling during a specific time window of a test. This can help reveal faults and other failures in the chip. Electro-optical crosstalk occurs when signals from neighboring components are read along with the signal from a target component, adding unwanted noise. As optical resolution reaches physical limitations and component density increases due to technology scaling, this crosstalk can become problematic, reducing a viability of laser probing when the feature sizes are much smaller than the optic probe spot.

BRIEF DESCRIPTION OF THE DRAWINGS

The accompanying drawings illustrate a number of exemplary implementations and are a part of the specification. Together with the following description, these drawings demonstrate and explain various principles of the present disclosure.

Figure 1:
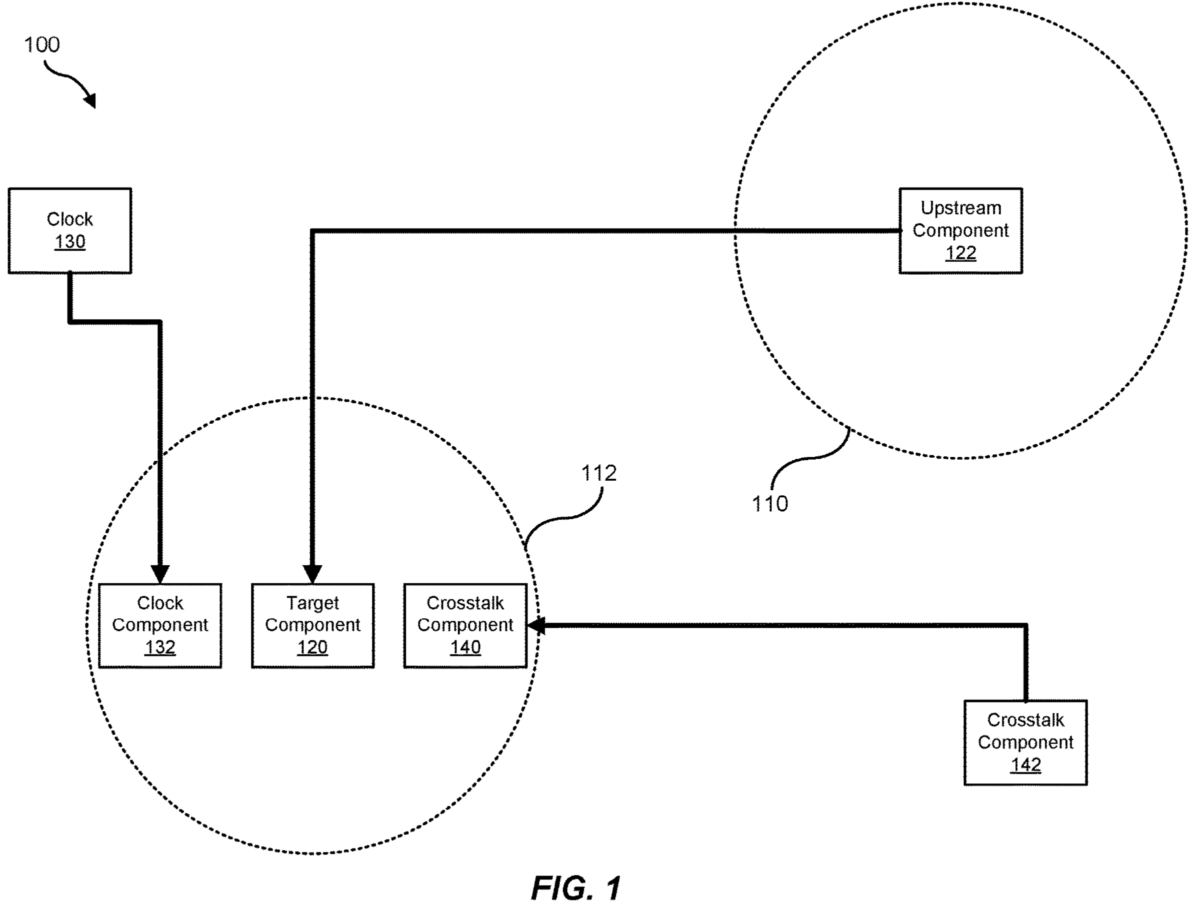
FIG. 1 is a block diagram of components for how laser stimulation can extract signals from crosstalk.

Throughout the drawings, identical reference characters and descriptions indicate similar, but not necessarily identical, elements. While the exemplary implementations described herein are susceptible to various modifications and alternative forms, specific implementations have been shown by way of example in the drawings and will be described in detail herein. However, the exemplary implementations described herein are not intended to be limited to the particular forms disclosed. Rather, the present disclosure covers all modifications, equivalents, and alternatives falling within the scope of the appended claims.

DETAILED DESCRIPTION

The present disclosure is generally directed to laser perturbation probing. As will be explained in greater detail below, implementations of the present disclosure use a first laser for stimulating a first circuit/component and use a second laser to measure a target circuit/component that is downstream the first circuit. By analyzing the measured signal, which can be further analyzed with respect to other measured signals (e.g., without stimulation), the systems and methods described herein provide accuracy in detecting faults or other errors. Thus, the systems and methods described herein improve the technical field of failure analysis and fault isolation for semiconductor manufacturing.

In one implementation, a method for laser perturbation probing includes (i) stimulating, using a first laser, a first circuit of a circuit system, (ii) measuring a signal, using a second laser, from a target circuit of the circuit system that is downstream of the first circuit, (iii) analyzing the measured signal, and (iv) detecting an error in the circuit system based on the analysis.

In some examples, the method further includes running a test pattern through the first circuit and the target circuit. In some examples, measuring the signal further comprises measuring the signal while stimulating the first circuit and stimulating the first circuit causes changes in data signal transitions of the test pattern. In some examples, the method further includes measuring a second signal, using the second laser without stimulating the first circuit, from the target circuit. In some examples, analyzing the measured signal further comprises determining a difference between the measured signal and the second measured signal, wherein the difference corresponds to the changes in data signal transitions, and reconstructing a target signal isolating the target circuit using the difference. In some examples, detecting the error further comprises comparing the target signal with an expected signal based on the test pattern, and detecting the error with the target circuit based on the comparison.

In some examples, stimulating the first circuit further comprises stimulating the first circuit using a high intensity pulse from the first laser to introduce a perturbation. In some examples, the high intensity pulse corresponds to a wavelength between approximately 1100 nm and 1580 nm, and a pulse width between approximately 100 fs and 10 ps. In some examples, analyzing the measured signal further comprises detecting the perturbation from the high intensity pulse. In some examples, analyzing the measured signal further comprises averaging multiple signals from multiple high intensity pulses to detect perturbations. In some examples, detecting the error further comprises detecting no perturbation from the high intensity pulse.

In some examples, stimulating the first circuit further comprises stimulating the first circuit using a high intensity pulse from the first laser to change a data value stored in the first circuit. In some examples, analyzing the measured signal further comprises detecting the changed data value propagated from the first circuit. In some examples, detecting the error further comprises not detecting the changed data value during the analysis. In some examples, the first circuit and the target circuit correspond to memory elements in a sequence and the test pattern corresponds to a compressed scan pattern.

In one implementation, a method for laser perturbation probing includes (i) stimulating, using a first laser, a first circuit of a circuit system, (ii) measuring a first signal, using a second laser while stimulating the first circuit, from a target circuit of the circuit system that is downstream of the first circuit, (iii) measuring a second signal, using the second laser without stimulating the first circuit, from the target circuit, (iv) analyzing the first and second measured signals, and (v) detecting an error in the circuit system based on the analysis.

In some examples, the method further includes running a test pattern through the first circuit and the target circuit, wherein stimulating the first circuit causes changes in data signal transitions of the test pattern.

In some examples, analyzing the measured signal further comprises determining a difference between the measured signal and the second measured signal, wherein the difference corresponds to the changes in data signal transitions, and reconstructing a target signal isolating the target circuit using the difference. In some examples, detecting the error further comprises comparing the target signal with an expected signal based on the test pattern, and detecting the error with the target circuit based on the comparison.

In one implementation, a method for laser perturbation probing includes (i) stimulating, using a high intensity pulse of a first laser, a first circuit of a circuit system to introduce a perturbation, (ii) measuring a signal, using a second laser, from a target circuit of the circuit system that is downstream of the first circuit, (iii) analyzing the measured signal to detect the perturbation, and (iv) detecting an error in the circuit system based on the analysis.

In some examples, detecting the error further comprises detecting no perturbation from the high intensity pulse.

In one implementation, a laser perturbation probing system for testing a circuit system includes a first laser, a second laser, a detector, and a control system configured to (i) stimulate, using the first laser, a first circuit of the circuit system, (ii) measure a signal, using the second laser and the detector, from a target circuit of the circuit system that is downstream of the first circuit, (iii) analyze the measured signal, and (iv) detect an error in the circuit system based on the analysis.

In some examples, the control system is further configured to run a test pattern through the first circuit and the target circuit. In some examples, measuring the signal further comprises measuring the signal while stimulating the first circuit and stimulating the first circuit causes changes in data signal transitions of the test pattern. In some examples, the control system is further configured to measure a second signal, using the second laser without stimulating the first circuit, from the target circuit. In some examples, analyzing the measured signal further comprises determining a difference between the measured signal and the second measured signal, wherein the difference corresponds to the changes in data signal transitions, and reconstructing a target signal isolating the target circuit using the difference. In some examples, detecting the error further comprises comparing the target signal with an expected signal based on the test pattern, and detecting the error with the target circuit based on the comparison.

In some examples, stimulating the first circuit further comprises stimulating the first circuit using a high intensity pulse from the first laser to introduce a perturbation. In some examples, the high intensity pulse corresponds to a wavelength between approximately 1100 nm and 1580 nm, and a pulse width between approximately 100 fs and 10 ps. In some examples, analyzing the measured signal further comprises detecting the perturbation from the high intensity pulse. In some examples, analyzing the measured signal further comprises averaging multiple signals from multiple high intensity pulses to detect perturbations. In some examples, detecting the error further comprises detecting no perturbation from the high intensity pulse.

In some examples, stimulating the first circuit further comprises stimulating the first circuit using a high intensity pulse from the first laser to change a data value stored in the first circuit. In some examples, analyzing the measured signal further comprises detecting the changed data value propagated from the first circuit. In some examples, detecting the error further comprises not detecting the changed data value during the analysis. In some examples, the first circuit and the target circuit correspond to memory elements in a sequence and the test pattern corresponds to a compressed scan pattern.

Features from any of the implementations described herein can be used in combination with one another in accordance with the general principles described herein. These and other implementations, features, and advantages will be more fully understood upon reading the following detailed description in conjunction with the accompanying drawings and claims.

The following will provide, with reference to FIGS. 1-9, detailed descriptions of various techniques for laser perturbation probing. Detailed descriptions of an example technique for laser perturbation probing and corresponding signals will be provided in connection with FIGS. 1-2. Detailed descriptions of another example technique for laser perturbation probing and corresponding signals will be provided in connection with FIGS. 3-4. Detailed descriptions of yet another example technique for laser perturbation probing and corresponding signals will be provided in connection with FIGS. 5-6. Detailed descriptions of corresponding methods will also be provided in connection with FIGS. 7-9.

Figure 2:
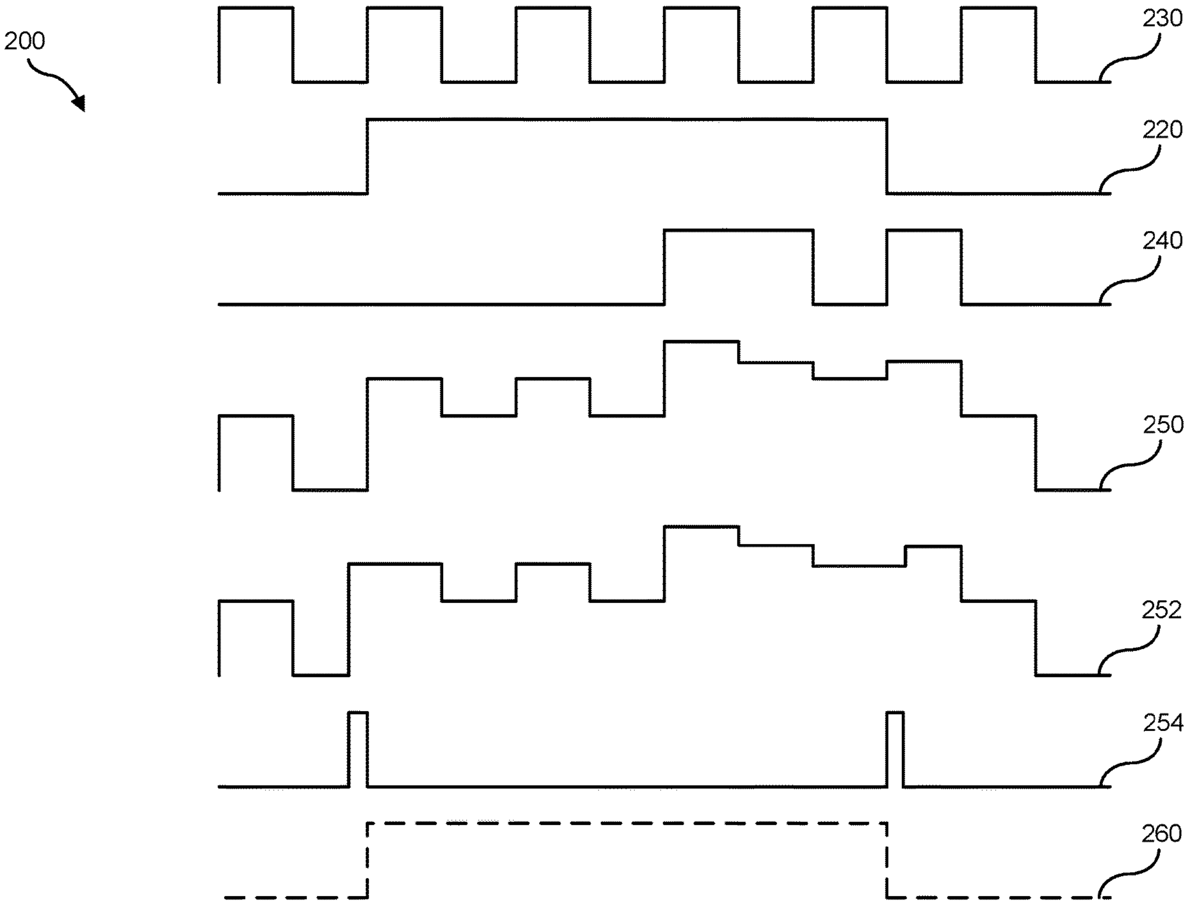
FIG. 2 is a signal diagram of extracting signals in reference to FIG. 1.

FIG. 1 is a block diagram of an example circuit system 100 for that can be tested using laser perturbation probing. System 100 corresponds to a computing device, such as a desktop computer, a laptop computer, a server, a tablet device, a mobile device, a smartphone, a wearable device, an augmented reality device, a virtual reality device, a network device, and/or an electronic device, and more particularly, a sub-system therein, such as a device (e.g., a processing device such as chiplets-smaller and in some examples more specialized processing units that can coordinate as a single chip-microprocessors, microcontrollers, Central Processing Units (CPUs), graphics processing units (GPUs), Field-Programmable Gate Arrays (FPGAs) that implement soft-core processors, Application-Specific Integrated Circuits (ASICs), systems on chip (SoCs), digital signal processors (DSPs), Neural Network Engines (NNEs), accelerators, graphics processing units (GPUs), a memory device such as Random Access Memory (RAM), Read Only Memory (ROM), flash memory, Hard Disk Drives (HDDs), Solid-State Drives (SSDs), optical disk drives, caches, portions of one or more of the same, variations or combinations of one or more of the same) comprising multiple circuits (e.g., integrated circuits) and/or components (e.g., transistors). FIG. 2 illustrates a signal diagram of various signals relating to system 100. FIGS. 1 and 2 provide simplified diagrams to discuss laser perturbation probing and are not necessarily drawn to scale.

As illustrated in FIG. 1, system 100 includes one or more circuits or components (e.g., transistors), such as a clock 130, a clock component 132, a target component 120, an upstream component 122, a crosstalk component 140, and a crosstalk component 142. Clock 130 can correspond to a clock circuit, which can drive/propagate a clock signal to another circuit, such as clock component 132. Target component 120, upstream component 122, crosstalk component 140, and crosstalk component 142 can each correspond to one or more circuits (e.g., transistors). Upstream component 122 can be upstream of target component 120 and drives/propagates signals downstream (e.g., to target component 120). Crosstalk component 142 can be upstream of crosstalk component 140 and drives/propagates signals downstream (e.g., to crosstalk component 140).

When testing the components of system 100, and specifically target component 120, using laser probing, an observe laser 112 (e.g., as represented by a dashed line circle representing a beam location with respect to the components) can be focused onto target component 120. As illustrated in FIG. 1, due to optical limitations of observe laser 112 as well as a density of components in system 100, observe laser 112 can overlap components that neighbor target component 120, such as clock component 132 and crosstalk component 140. Each neighboring component can produce crosstalk signals that are measured along with signals from target component 120.

Turning to FIG. 2, FIG. 2 illustrates a signal diagram 200 including a clock signal 230, an expected target signal 220, a crosstalk signal 240, a first probe signal 250, a second probe signal 252, a differential signal 254, and a reconstructed signal 260. Clock signal 230 corresponds to a clock signal in isolation (e.g., as propagated by clock 130 and/or clock component 132). Expected target signal 220 corresponds to a target signal in isolation (e.g., as propagated by upstream component 122 and/or target component 120), which in some examples can be a data signal. Crosstalk signal 240 corresponds to another (data) signal in isolation (e.g., as propagated by crosstalk component 142 and/or crosstalk component 140).

First probe signal 250 corresponds to a signal as measured by a laser probe (e.g., observe laser 112), and more specifically measured by observe laser 112 focused on target component 120 as shown in FIG. 1. Detecting a fault or error in system 100 using laser probing includes identifying a component known to be good (e.g., from a previous iteration of laser probing or other testing), which in FIG. 1 can correspond to upstream component 122, and iteratively testing components farther downstream to closer downstream to isolate and identify the faulty component. Using first probe signal 250, detecting a faulty component can include comparing a measured signal from the tested component (e.g., target component 120) with an expected signal (e.g., as would be propagated by upstream component 122 and can further be based on a test pattern that is run through upstream component 122 and target component 120). A difference between the measured signal and expected signal can indicate a fault or error. However, as can be seen in FIGS. 1 and 2, first probe signal 250 is a combination of various signals (e.g., clock signal 230, expected target signal 220, and crosstalk signal 240) measured from the various components (e.g., clock component 132, target component 120, and crosstalk component 140). It can be difficult to distinguish between crosstalk signals and an actual error in the expected signal, particularly as a number of crosstalk components increases.

The systems and methods described herein allow for accurately removing unwanted signals from first probe signal 250. Using a dual-laser system, a second laser, namely a perturb laser 110 (e.g., as represented by a dashed line circle representing a beam location with respect to the components) can be focused onto upstream component 122. Perturb laser 110 can stimulate upstream component 122 to cause changes in data signal transitions (e.g., low-to-high, and high-to-low) of the test pattern. For instance, stimulating upstream component 122 can cause a phase shift in data signal transitions. Moreover, upstream component 122 can be selected to only affect target component 120 when stimulated, such that other crosstalk components (e.g., clock component 132 and crosstalk component 140) are not similarly affected, and further that any neighboring components that are stimulated with perturb laser 110 are also not upstream of any crosstalk components. For instance, although not shown in FIG. 1, upstream component 122 can have neighboring components. However, because upstream component 122 is sufficiently far away from, for example, crosstalk component 142, only target component 120 will exhibit the change in test pattern when measured by observe laser 112.

Returning to FIG. 2, second probe signal 252 corresponds to a signal measured by observe laser 112 while stimulating upstream component 122 using perturb laser 110. As described herein, the stimulation/perturbation can cause phase shifts. To analyze the measured signals, a difference between first probe signal 250 (e.g., without stimulation) and second probe signal 252 (e.g., with stimulation) can be found, represented by differential signal 254. As illustrated in FIG. 2, differential signal 254 indicates the changes in data signal transitions. Because differential signal 254 corresponds to the stimulated response, and only target component 120 was stimulated, differential signal 254 effectively eliminates other crosstalk signals (e.g., clock signal 230 and crosstalk signal 240). Using differential signal 254 (and in some examples first probe signal 250 and/or second probe signal 252), reconstructed signal 260 can be produced, representing a signal from target component 120 without crosstalk.

In some examples, because a magnitude of the phase shift in signals can be significantly smaller than clock speed, a resolution of the signal sampling can be greater than what an oscilloscope can often provide. Accordingly, a high speed digitizer can be used for sampling the signals.

To detect errors or faults, reconstructed signal 260 can be compared to the test pattern (e.g., expected target signal 220). Reconstructed signal 260 matching expected target signal 220 can indicate no error. In some examples, differences between reconstructed signal 260 and expected target signal 220 can indicate an error, and a type of difference can indicate a type of error.

Figure 3:
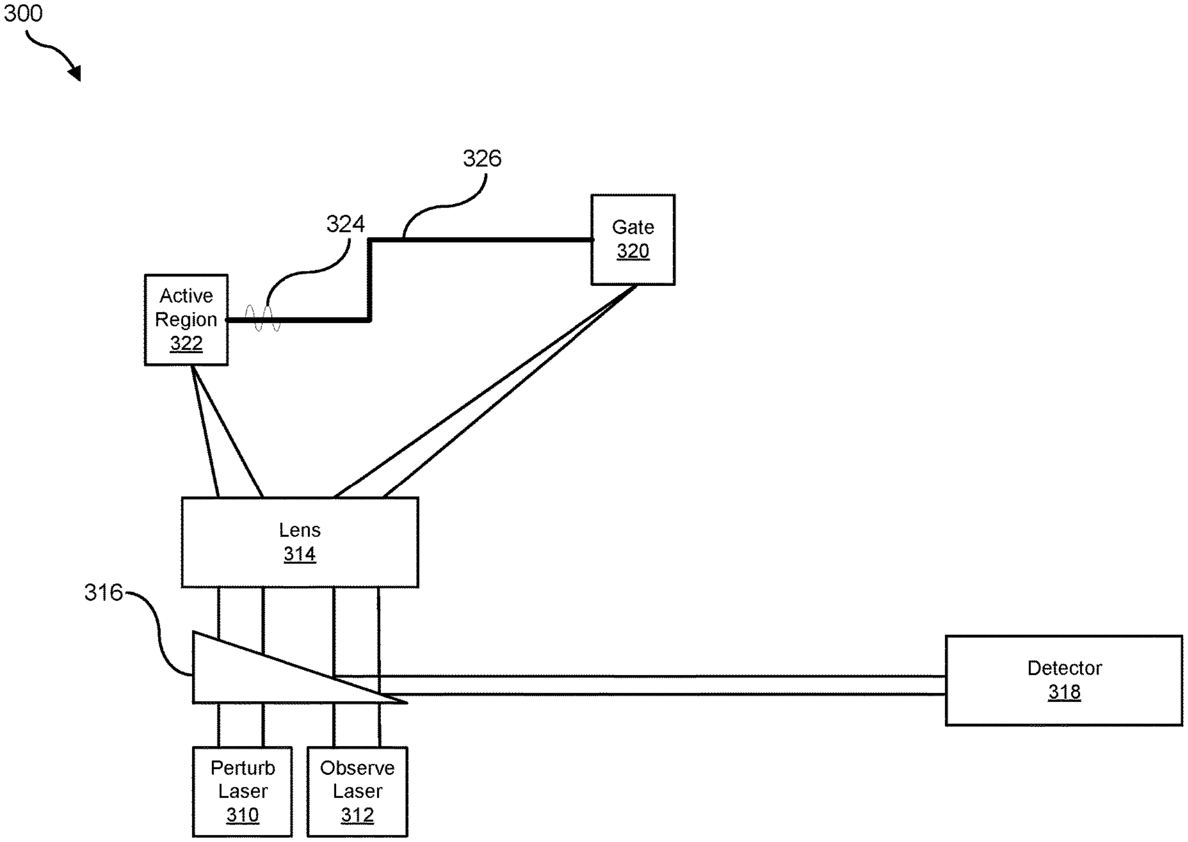
FIG. 3 is a diagram of testing a net by injecting a signal.
Figure 4:
FIG. 4 is a signal diagram of signals in reference to FIG. 3.
Figure 4:
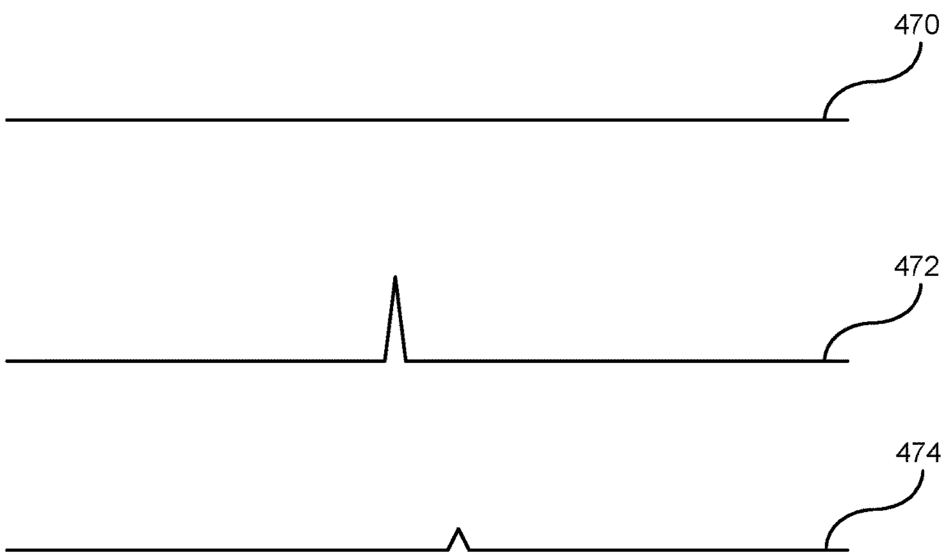

FIG. 3 is a block diagram of an example environment 300 for laser perturbation probing to test a device as described herein. FIG. 4 illustrates a signal diagram of various signals relating to environment 300. FIGS. 3 and 4 provide simplified diagrams to discuss laser perturbation probing and are not necessarily drawn to scale.

As illustrated in FIG. 3, environment 300 includes one or more devices components, such as a perturb laser 310, an observe laser 312, a lens 314, a reflector 316, and a detector 318, all of which together can be part of a laser perturbation probing system (e.g., a dual-laser scanning system). Although not shown in FIG. 3, in some implementations the laser perturbation probing system can include a control system (which can include, for example, a processor, a memory, and instructions for various actions and in some examples further include systems for measuring and/or analyzing signals) to perform and or facilitate the various actions of the laser perturbation probing system described herein (including, e.g., steps of methods 700, 800, and/or 900). Lens 314 can correspond to any optical element appropriate for focusing perturb laser 310 and/or observe laser 312 and can correspond to one or more components as needed. Reflector 316 can correspond to any optical element appropriate for directing perturb laser 310 and/or observe laser 312 as needed (e.g., to lens 314 and/or detector 318) and can correspond to one or more components as needed. Detector 318 can correspond to an optical sensing device, such as a high-speed photo detector, for measuring signals from lasers (e.g., observe laser 312). FIG. 3 illustrates an implementation of a dual-laser system, although in other examples, other configurations can be used.

Environment 300 also includes an active region 322 of a first component and a gate 320 of a second component interconnected with the first component via a net 326. A transistor (e.g., a metal-oxide-semiconductor field-effect transistor (MOSFET)) that feeds to another transistor forms an interconnected net (e.g., net 326), for example from a source or drain channel of the first transistor (e.g., active region 322) to a gate of the second transistor (e.g., gate 320). If the transistors are biased properly, then any electrical signal, including perturbations, from active region 322 would propagate to gate 320 through net 326. However, if the net has faults, this electrical signal will fail to propagate.

In FIG. 3, perturb laser 310 (e.g., a femtosecond laser in some examples) can be directed to stimulate active region 322 using a high intensity pulse (e.g., in some examples having a wavelength between approximately 1100 nm and 1580 nm, and a pulse width between approximately 100 fs and 10 ps) to cause a perturbation 324. A sufficient high intensity pulse can cause a two-photon absorption (TPA) effect, generating an excited electronic state as perturbation 324. Perturbation 324 can propagate through net 326 and detected non-invasively by observe laser 312 (e.g., a continuous wave laser in some examples).

FIG. 4 illustrates a signal diagram 400 corresponding to environment 300. FIG. 4 includes a test pattern 470, a laser signal 472, and a measured signal 474. Test pattern 470 indicates that rather than a specific data signal, a correct biasing is needed (e.g., a supply voltage being greater than or equal to a threshold voltage). Laser signal 472 indicates a pulse to perturb the net, and measured signal 474 indicates detection of the perturbation. In some examples, multiple iterations can be used, such as millions of laser pulses and averaging millions of subsequent samples. In some examples, the magnitude of the perturbation can be small enough (for example with respect to other electrical signals) that averaging multiple samples can more accurately indicate whether the perturbation is detected.

To analyze the signals and detect errors in net 326, measured signal 474 can be analyzed to determine whether perturbation 324 was detected. Detecting perturbation 324 can indicate no error whereas detecting no perturbation can indicate a fault or error in net 326.

Figure 5:
FIG. 5 is a diagram of testing sequential circuits with memory elements such as a latch.
Figure 5:
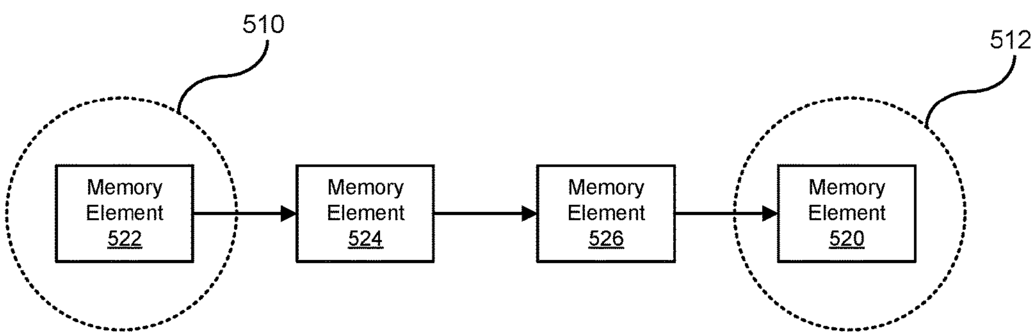
Figure 6:
FIG. 6 is a signal diagram of signals in reference to FIG. 5.
Figure 6:
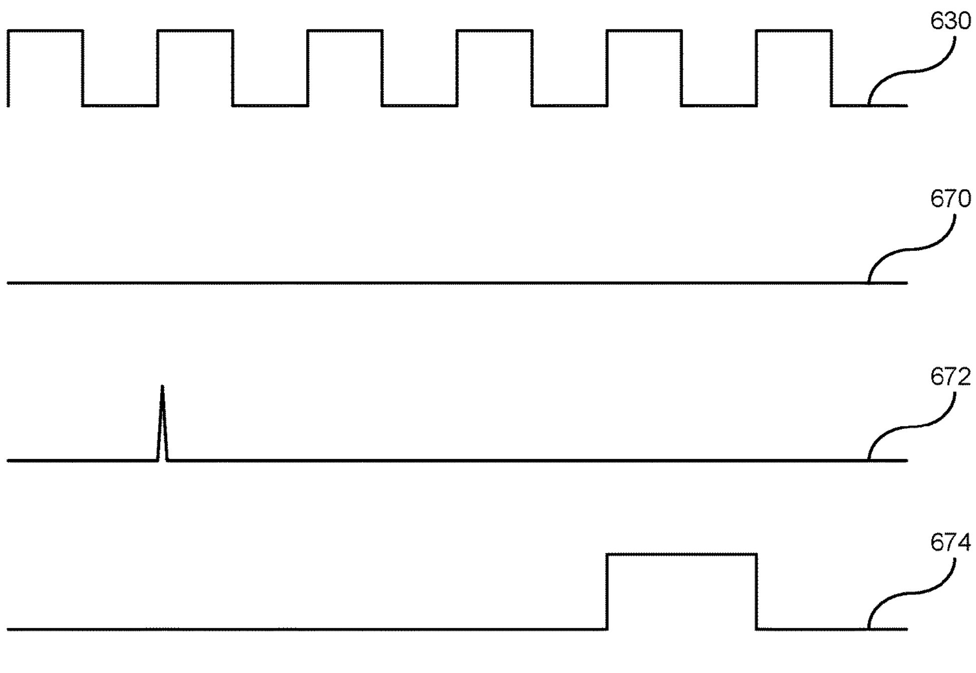

FIG. 5 is a block diagram of an example system 500 that can be tested using laser perturbation probing. System 500 corresponds to a device as described herein and more specifically, can correspond to a sequential circuit, such as a scan chain. FIG. 6 illustrates a signal diagram 600 of various signals relating to system 500. FIGS. 5 and 6 provide simplified diagrams to discuss laser perturbation probing and are not necessarily drawn to scale.

As illustrated in FIG. 5, system 500 includes one or more circuits or components, such as a memory element 522, a memory element 524, a memory element 526, and a memory element 520, each of which can correspond to a memory element such as a latch circuit, a flop, a register, other circuits that can contain a latch as a memory element, etc. that can be chained sequentially such that a data signal can propagate from memory element 522 to memory element 520. Accordingly, memory element 522 is upstream from memory element 520.

As described herein, a high intensity pulse from a laser can cause perturbations in circuits/components. A single event upset (SEU) can occur when radiation strikes a storage element such that a stored value can be changed (e.g., from logic 0 to logic 1). In some examples, a controlled SEU can be used to observe changes in a scan chain or other sequential circuit and detect potential faults.

A perturb laser 510 can be directed onto memory element 522. Perturb laser 510 can stimulate memory element 522 with a high intensity pulse to cause an SEU in memory element 522. Using an observe laser 512, any changes in memory element 520 (that is downstream of memory element 522) can be detected. Although FIG. 5 illustrates observe laser 512 targeting memory element 520, in other examples, other components can be targeted.

Turning to FIG. 6, FIG. 6 includes a clock signal 630, a test pattern 670, a laser signal 672, and a measured signal 674. Clock signal 630 corresponds to a clock signal driving the memory elements of FIG. 5 and in some examples, each clock cycle can correspond to data propagating from one memory element to a next memory element. Test pattern 670 corresponds to a data signal driven through the memory elements of FIG. 5 (e.g., to memory element 522). Test pattern 670 can be selected as a quiet background signal to detect the propagated SEU more easily and, in some examples, can be a compressed pattern, such as continuous 0 values as in FIG. 6.

Laser signal 672 indicates a particular clock cycle in which perturb laser 510 stimulates memory element 522 to cause the SEU (changing the 0 value of test pattern 670 to 1). As illustrated in FIG. 5, memory element 520 is three memory elements downstream from memory element 522, such that the SEU propagates to memory element 520 after three clock cycles. Thus, as illustrated in FIG. 6, measured signal 674 indicates the SEU after three cycles. In other words, analyzing measured signal 674 includes detecting that the changed data value propagated from memory element 520 after an appropriate number of cycles. A failure to detect the changed data value at the appropriate cycle can indicate an error or fault, for example a fault in a memory element or interconnect preventing the SEU from propagating.

Figure 7:
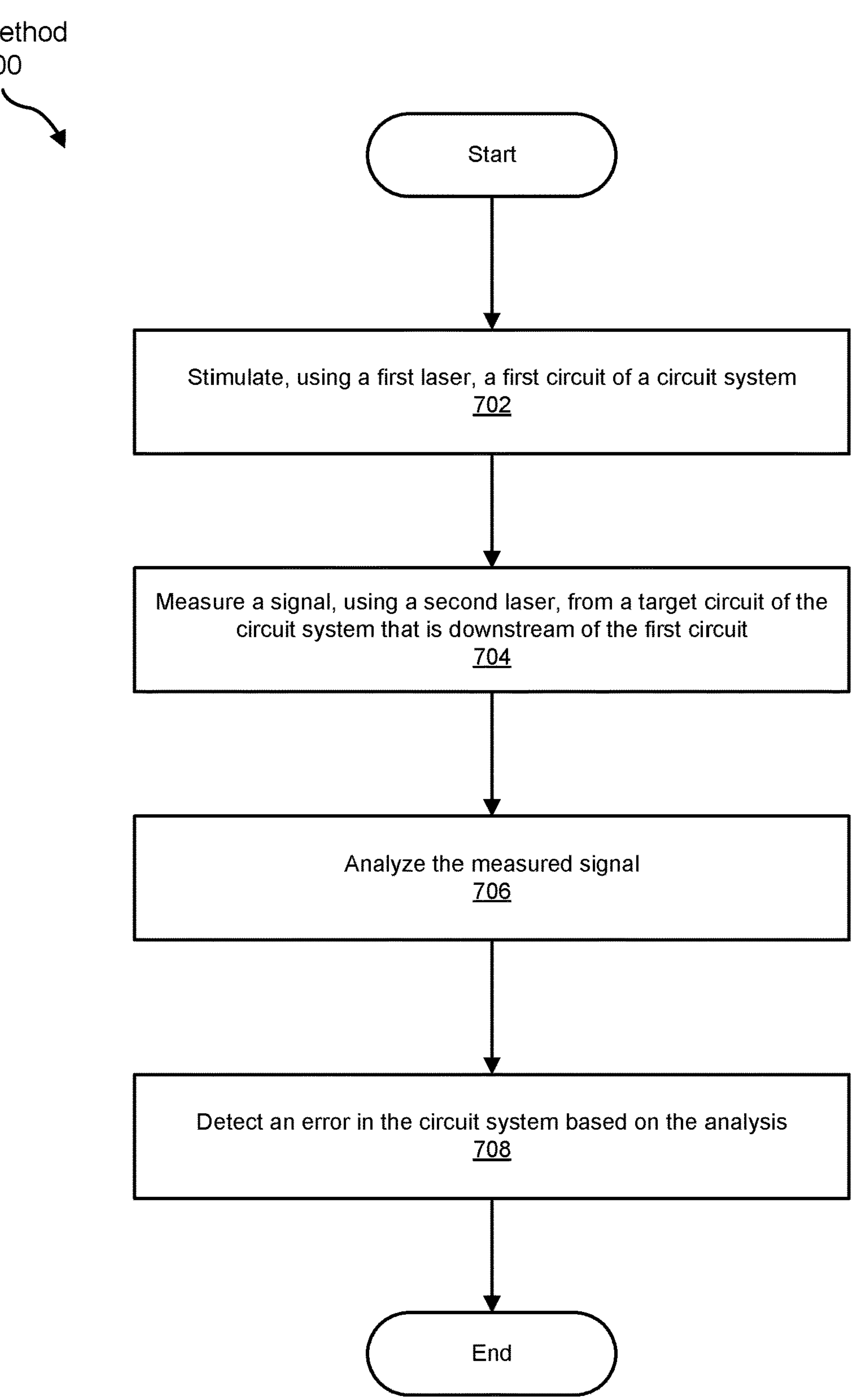
FIG. 7 is a flow diagram of an exemplary method for laser perturbation probing.

FIG. 7 is a flow diagram of an exemplary method 700 for laser perturbation probing. The steps shown in FIG. 7 can be performed by any suitable system having, for example, dual-lasers capable of being independently focused/operated, along with an instrument (e.g., a high speed digitizer) for collecting waveform samples at a sufficient resolution. In one example, each of the steps shown in FIG. 7 represent an algorithm whose structure includes and/or is represented by multiple sub-steps, examples of which will be provided in greater detail below. In addition, although FIG. 7 illustrates a sequence of steps, in other examples, the steps can be performed in any appropriate order.

As illustrated in FIG. 7, at step 702 one or more of the systems described herein stimulate, using a first laser, a first circuit of a circuit system. The systems described herein can perform step 702 in a variety of ways. In one example, stimulating the first circuit further includes stimulating the first circuit using a high intensity pulse from the first laser to introduce a perturbation (see, e.g., FIGS. 1-4). In some examples, the high intensity pulse corresponds to a wavelength between approximately 1100 nm and 1580 nm, and a pulse width between approximately 100 fs and 10 ps (see, e.g., FIGS. 3-4).

In another example, stimulating the first circuit further includes stimulating the first circuit using a high intensity pulse from the first laser to change a data value stored in the first circuit (see, e.g., FIGS. 5-6). In some examples, the first circuit and the target circuit correspond to memory elements in a sequence and the test pattern corresponds to a compressed pattern (see, e.g., FIGS. 5-6).

At step 704 one or more of the systems described herein measure a signal, using a second laser, from a target circuit of the circuit system that is downstream of the first circuit. The systems described herein can perform step 704 in a variety of ways. In one example, a test pattern can be run through the first circuit and the target circuit, and measuring the signal further includes measuring the signal while stimulating the first circuit and stimulating the first circuit causes changes in data signal transitions of the test pattern (see, e.g., FIGS. 1-2 and 5-6).

Some examples further include measuring a second signal, using the second laser without stimulating the first circuit, from the target circuit (see, e.g., FIGS. 1-2). In some examples, measuring the target circuit without stimulating the first circuit can occur before measuring the target circuit with stimulating the first circuit.

At step 706 one or more of the systems described herein analyze the measured signal. The systems described herein can perform step 706 in a variety of ways. In one example, analyzing the measured signal further includes determining a difference between the measured signal and the second measured signal (the difference corresponding to the changes in data signal transitions) and reconstructing a target signal isolating the target circuit using the difference (see, e.g., FIGS. 1 2).

In some examples, analyzing the measured signal further comprises detecting the perturbation from the high intensity pulse (see, e.g., FIGS. 3-6). In some examples, analyzing the measured signal further includes averaging multiple signals from multiple high intensity pulses to detect perturbations (see, e.g., FIGS. 3-4). In some examples, analyzing the measured signal further includes detecting the changed data value propagated from the first circuit (see, e.g., FIGS. 5-6).

As illustrated in FIG. 7, at step 708 one or more of the systems described herein detect an error in the circuit system based on the analysis. The systems described herein can perform step 708 in a variety of ways. In one example, detecting the error further includes comparing the target signal with an expected signal based on the test pattern, and detecting the error with the target circuit based on the comparison (see, e.g., FIGS. 1-2). In some examples, detecting the error further includes detecting no perturbation from the high intensity pulse (see, e.g., FIGS. 3-6). In some examples, detecting the error further comprises not detecting the changed data value during the analysis (see, e.g., FIGS. 5-6).

Figure 8:
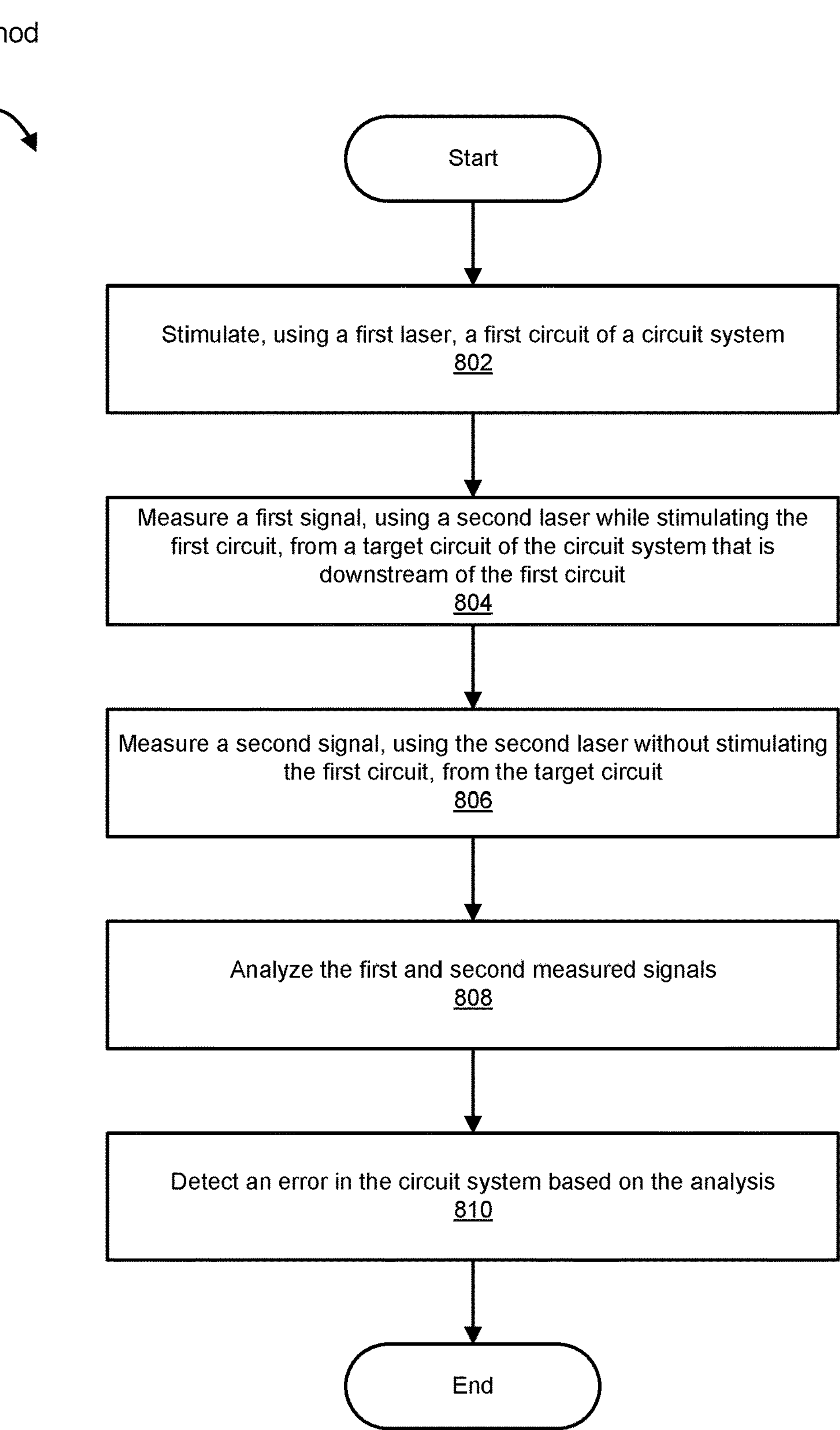
FIG. 8 is a flow diagram of another exemplary method for laser perturbation probing.

FIG. 8 is a flow diagram of an exemplary method 800 for laser perturbation probing. The steps shown in FIG. 8 can be performed by any suitable system having, for example, dual-lasers capable of being independently and concurrently focused/operated, along with an instrument (e.g., a high speed digitizer) for collecting waveform samples at a sufficient resolution. In one example, each of the steps shown in FIG. 8 represent an algorithm whose structure includes and/or is represented by multiple sub-steps, examples of which will be provided in greater detail below. Although FIG. 8 illustrates a sequence of steps, in other examples, the steps can be performed in any appropriate order.

As illustrated in FIG. 8, at step 802 one or more of the systems described herein stimulate, using a first laser, a first circuit of a circuit system. For example, upstream component 122 can be stimulated by perturb laser 110.

At step 804 one or more of the systems described herein measure a first signal, using a second laser while stimulating the first circuit, from a target circuit of the circuit system that is downstream of the first circuit. For example, target component 120 can be measured using observe laser 112 while stimulating upstream component 122, to measure second probe signal 252.

The systems described herein can perform step 804 in a variety of ways. Some examples, include running a test pattern through the first circuit and the target circuit, such that stimulating the first circuit causes changes in data signal transitions of the test pattern.

At step 806 one or more of the systems described herein measure a second signal, using the second laser without stimulating the first circuit, from the target circuit. For example, target component 120 can be measured using observe laser 112 without stimulating upstream component 122, to measure first probe signal 250. In some examples, measuring without stimulation (e.g., step 806) can occur before measuring with stimulation (e.g., steps 802-804).

At step 808 one or more of the systems described herein analyze the first and second measured signals. For example, first probe signal 250 and second probe signal 252 can be analyzed.

The systems described herein can perform step 808 in a variety of ways. In one example, analyzing the measured signal further comprises determining a difference (e.g., differential signal 254) between the measured signal and the second measured signal, wherein the difference corresponds to the changes in data signal transitions, and reconstructing a target signal isolating the target circuit using the difference (e.g., reconstructed signal 260).

At step 810 one or more of the systems described herein detect an error in the circuit system based on the analysis. The systems described herein can perform step 810 in a variety of ways. In one example, detecting the error further comprises comparing the target signal (e.g., reconstructed signal 260) with an expected signal (e.g., expected target signal 220) based on the test pattern and detecting the error with the target circuit based on the comparison.

Figure 9:
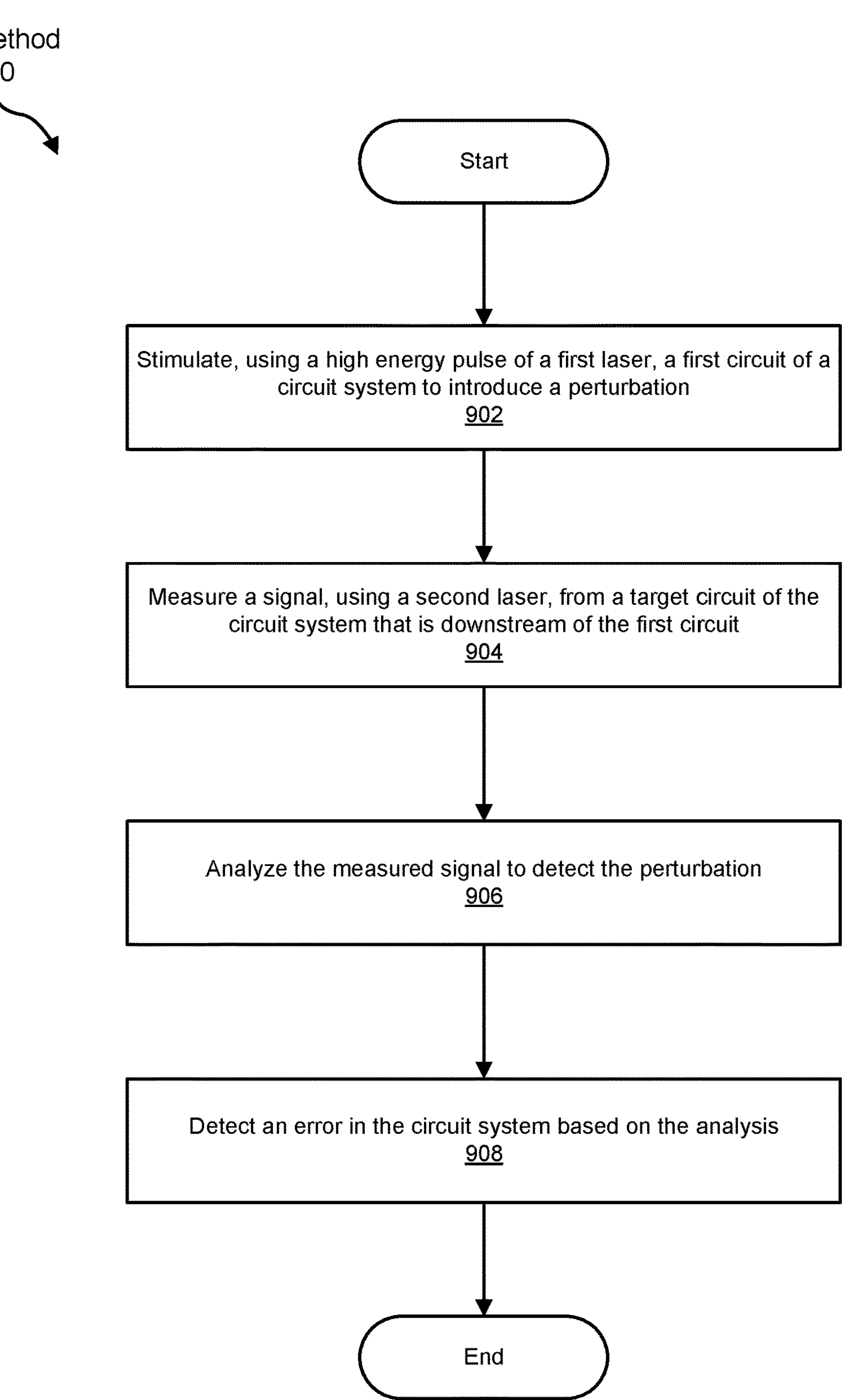
FIG. 9 is a flow diagram of yet another exemplary method for laser perturbation probing.

FIG. 9 is a flow diagram of an exemplary method 900 for laser perturbation probing. The steps shown in FIG. 9 can be performed by any suitable system having, for example, dual-lasers capable of being independently focused/operated, along with an instrument (e.g., a high speed digitizer) for collecting waveform samples at a sufficient resolution. In one example, each of the steps shown in FIG. 9 represent an algorithm whose structure includes and/or is represented by multiple sub-steps, examples of which will be provided in greater detail below.

As illustrated in FIG. 9, at step 902 one or more of the systems described herein stimulate, using a high intensity pulse of a first laser, a first circuit of a circuit system to introduce a perturbation. For example, perturb laser 310 can stimulate active region 322 to introduce perturbation 324. In another example, perturb laser 510 can stimulate memory element 522 to introduce an upset.

At step 904 one or more of the systems described herein measure a signal, using a second laser, from a target circuit of the circuit system that is downstream of the first circuit. For example, observe laser 312 can measure measured signal 474 from gate 320. In another example, observe laser 512 can measure measured signal 674 from memory element 520.

As illustrated in FIG. 9, at step 906 one or more of the systems described herein analyze the measured signal to detect the perturbation. For example, measured signal 474 can be analyzed (e.g., after multiple iterations of perturbing to average the subsequent measurements) to detect the perturbation. In another example, measured signal 674 can be analyzed to detect the SEU after an appropriate number of clock cycles.

At step 908 one or more of the systems described herein detect an error in the circuit system based on the analysis.

For example, detecting the error further includes detecting no perturbation from the high intensity pulse module. In one example, detecting no perturbation in measured signal 474 can indicate an error or fault. In another example, detecting no SEU in measured signal 674 at the appropriate clock cycle can indicate an error or fault. In another example, the signal detected can be anomalous when compared with a reference signal from a known good circuitry or device.

As detailed above, laser probing detects activity in individual transistors by focusing infra-red (IR) lasers into transistor through the silicon substrate. This technique can be used in failure analysis and/or fault isolation, and post-silicon design debugging. The optical resolution (e.g., beam spot) can be limited to about 200 nm. Thus, probing a transistor at a smaller size such as less than 50 nm, can result in a cacophony of signals from surrounding transistors (e.g., crosstalk). Electrooptical crosstalk is a fundamental problem that can limit failure analysis capabilities for emerging technologies due to resolution limitation of the optical probes in collecting signals from individual transistors.

The systems and methods provided herein can advantageously reduce a dependence on the resolution of the laser probe and can eliminate or mitigate the background cross-talk, effectively overcoming the limitations of optics. As described herein, laser perturbation probing (LPP) is a process flow that uses dual lasers simultaneously, one to stimulate a net/target path, and another to observe, in real-time, changes that the stimulation laser imparted to the path. By targeting an upstream transistor in the path, the moment at which a transition occurs in the target transistor can be altered, for example by about 10-50 ps. Since only the target path is perturbed, a differential between measurements with and without the perturbation can indicate transitions in the target transistor, allowing separation of its signals from crosstalking neighbors. This technique can effectively combat optical resolution challenges and provide solutions for partially deconstructed 3D stacked devices.

A dual laser beam scanner allows two independently controlled infra-red (IR) laser beams to be used in tandem within a small (<100 um) field of view. Various methods that can use such a dual laser beam scanner are described herein and summarized below.

A first implementation can use signal extraction based on the underlying physical properties that laser stimulation can cause a change in the transistor performance. In some examples, this implementation can utilize (i) a dual beam scanner system with high numerical aperture (NA) optics, laser probing hardware and optionally, cooling, (ii) continuous wave (CW) near infra-red (NIR) lasers of different wavelengths (e.g., 1064 nm, 1319 nm, other appropriate wavelengths) that can use pulsed lasers for the laser stimulation effect, and (iii) a high speed high bandwidth digitizer.

In some examples, the first implementation can include (a) collecting a waveform of target signal, (b) stimulating upstream to the target signal, (c) recollecting the waveform at same location (e.g., target signal), (d) XORing the waveforms (e.g., with software or other appropriate instrument), (e) reconstructing the signal (e.g., with software or other appropriate instrument), and optionally (f) comparing the reconstructed signal with the expected response.

A second implementation can use laser perturbation effects to inject a signal into a net (e.g., connected regions between transistors). Photocarriers that are injected into the active (e.g., driver) region of the net will momentarily charge up the net, causing a subtle response in the gates of other transistors that the net feeds to. Two-photon absorption techniques, which can be achieved using femtosecond lasers, can generate and isolate photocarriers within the transistor with minimum thermal effect on the substrate. In some examples, this implementation can use (i) a dual beam scanner system with high NA optics, laser probing hardware and optionally, cooling, (ii) one laser beam that is CW NIR laser (e.g., 1064 nm, 1319 nm, etc.) and second laser beam that is an approximately >1100 nm pulse duration (e.g., 100 fs-100 ps) laser beam that is filtered by an electro-optic modulator (EOM) and/or acousto-optics modulator (AOM).

In some examples, the second implementation can include (a) powering up the tested device higher than a threshold voltage of the target transistor, but without requiring any clocks or signals, (b) stimulating the active regions (driver) of the net using an IR fs pulsed laser (e.g., having wavelength ranges approximately >1100 nm to minimize photocarrier generation in the substrate), (c) picking the laser pulse using optical modulators (e.g., an EOM or AOM) to only allow a narrow time window for the stimulation, for example a single pulse within a duration of 10 ns-100 us, or alternatively, use a mode-lock frequency of 50 MHz or lower, (d) syncing the laser pulse window with the oscilloscope, and (e) parking the second probe on the gate (receiver) of the net and observing the signals over several thousand to millions of averages.

A third implementation can use single event upsets to inject a signal into sequential circuitry and/or launch flops. A high density of photocarriers (e.g., fs/ps duration light pulses) injected into logic/memory elements of a sequential circuitry such as a scan flop can flip the data stored in the latch (e.g., from logic 0/low to logic 1/high), a phenomenon known as Single Event Upset (SEU). This can cause data corruption/manipulation at the moment the photocarriers were injected, which can readily be detected by the laser probe. By controlling the signal injection, carefully selecting electrical patterns in the sequential circuitry, and injecting signals within combinational circuitry that have inputs from these scan flops, advanced stimulation capabilities can be achieved. In some examples, this implementation can use (i) a dual beam scanner system with high NA optics, laser probing hardware and optionally, cooling, and (ii) one laser beam that is CW NIR laser (e.g., 1064 nm, 1319 nm, etc.) and second laser beam that is an approximately >1100 nm pulse duration (e.g., 100 fs-100 ps) laser beam that is filtered by an EOM/AOM.

In some examples, the third implementation includes (a) powering up the tested device, running scan clocks, and walking Os (or 1*s*) into the scan chain, (b) picking a scan flop that launches signals to the combinational circuitry of interest (which in some examples is another scan flop to debug the scan chain itself), (c) with a precisely timed and modulated pulse of laser, stimulating the latch such that it triggers an SEU response within the launch flop, (d) propagating the corrupted date (e.g., as part of the next cycle), and (e) perform signal subtraction (e.g., as described herein) to highlight the occurrence of an additional data pulse that was introduced by the photocarrier (e.g., the corrupted data). Because the corrupted data is locally generated, and timed carefully, the effect of this generated signal on the target circuitry can be observed.

In the implementations described herein, signals can be accurately extracted from target circuitries despite the limited resolution of the tool. Because silicon is opaque to shorter wavelengths of light, leaving few replacements for optical resolution, probing is limited to the IR wavelengths.

As detailed above, the computing devices and systems described and/or illustrated herein broadly represent any type or form of computing device or system capable of executing computer-readable instructions, such as instructions corresponding to the methods described herein. In their most basic configuration, these computing device(s) each include at least one memory device and at least one physical processor.

In some examples, the term "memory device" generally refers to any type or form of volatile or non-volatile storage device or medium capable of storing data and/or computer-readable instructions. In one example, a memory device stores, loads, and/or maintains one or more of the modules and/or circuits described herein. Examples of memory devices include, without limitation, latch circuits, Random Access Memory (RAM), Read Only Memory (ROM), flash memory, Hard Disk Drives (HDDs), Solid-State Drives (SSDs), optical disk drives, caches, variations, or combinations of one or more of the same, or any other suitable storage memory.

In some examples, the term "physical processor" generally refers to any type or form of hardware-implemented processing unit capable of interpreting and/or executing computer-readable instructions. In one example, a physical processor accesses and/or modifies one or more modules stored in the above-described memory device. Examples of physical processors include, without limitation, microprocessors, microcontrollers, Central Processing Units (CPUs), Field-Programmable Gate Arrays (FPGAs) that implement softcore processors, Application-Specific Integrated Circuits (ASICs), systems on a chip (SoCs), digital signal processors (DSPs), Neural Network Engines (NNEs), accelerators, graphics processing units (GPUs), portions of one or more of the same, variations or combinations of one or more of the same, or any other suitable physical processor.

The process parameters and sequence of the steps described and/or illustrated herein are given by way of example only and can be varied as desired. For example, while the steps illustrated and/or described herein are shown or discussed in a particular order, these steps do not necessarily need to be performed in the order illustrated or discussed. The various exemplary methods described and/or illustrated herein can also omit one or more of the steps described or illustrated herein or include additional steps in addition to those disclosed.

The preceding description has been provided to enable others skilled in the art to best utilize various aspects of the exemplary implementations disclosed herein. This exemplary description is not intended to be exhaustive or to be limited to any precise form disclosed. Many modifications and variations are possible without departing from the spirit and scope of the present disclosure. The implementations disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising".

What is claimed is:

1. A laser perturbation probing system for testing a circuit system, comprising:

- a first laser configured to emit a first pulse to a first location;
- a second laser configured to emit a second pulse to a second location independently from the first laser;
- a detector; and
- a control system configured to:
  - stimulate, using the first pulse from the first laser, a first circuit of the circuit system that is at the first location;
  - measure a signal, using the second pulse from the second laser and the detector, from a target circuit of the circuit system that is at the second location and receives a data signal from the first circuit;
  - analyze the measured signal; and
  - detect an error in the circuit system based on the analysis.

2. The system of claim 1, wherein the control system is further configured to run a test pattern through the first circuit and the target circuit.

3. The system of claim 2, wherein measuring the signal further comprises measuring the signal while stimulating the first circuit and stimulating the first circuit causes changes in data signal transitions of the test pattern.

4. The system of claim 3, wherein the control system is further configured to measure a second signal, using the second laser without stimulating the first circuit, from the target circuit.

5. The system of claim 4, wherein analyzing the measured signal further comprises:

- determining a difference between the measured signal and the second measured signal, wherein the difference corresponds to the changes in data signal transitions; and
- reconstructing a target signal isolating the target circuit using the difference.

6. The system of claim 5, wherein detecting the error further comprises:

- comparing the target signal with an expected signal based on the test pattern; and
- detecting the error with the target circuit based on the comparison.

7. The system of claim 2, wherein stimulating the first circuit further comprises stimulating the first circuit using a high intensity pulse from the first laser to change a data value stored in the first circuit.

8. The system of claim 7, wherein analyzing the measured signal further comprises detecting the changed data value propagated from the first circuit.

9. The system of claim 7, wherein detecting the error further comprises not detecting the changed data value during the analysis.

10. The system of claim 7, wherein the first circuit and the target circuit correspond to memory elements in a sequence and the test pattern corresponds to a compressed pattern.

11. The system of claim 1, wherein stimulating the first circuit further comprises stimulating the first circuit using a high intensity pulse from the first laser to introduce a perturbation.

12. The system of claim 11, wherein the high intensity pulse corresponds to a wavelength between approximately 1100 nm and 1580 nm, and a pulse width between approximately 100 fs and 10 ps.

13. The system of claim 11, wherein analyzing the measured signal further comprises detecting the perturbation from the high intensity pulse.

14. The system of claim 13, wherein analyzing the measured signal further comprises averaging multiple signals from multiple high intensity pulses to detect perturbations.

15. The system of claim 11, wherein detecting the error further comprises detecting no perturbation from the high intensity pulse.

* * * * *